(12) United States Patent
Frosch et al.

(10) Patent No.: US 9,161,431 B2
(45) Date of Patent: Oct. 13, 2015

(54) MULTILAYERED PRINTED CIRCUIT BOARD, MORE PARTICULARLY FLAME-RESISTANT AND/OR SMOKE-SUPPRESSING MULTILAYERED PRINTED CIRCUIT BOARD

(75) Inventors: Ronald Frosch, Feldbach (AT); Manfred Riedler, Kumberg (AT)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 729 days.

(21) Appl. No.: 13/381,454

(22) PCT Filed: Jun. 25, 2010

(86) PCT No.: PCT/AT2010/000233
§ 371 (c)(1),
(2), (4) Date: Dec. 29, 2011

(87) PCT Pub. No.: WO2011/000009
PCT Pub. Date: Jan. 6, 2011

(65) Prior Publication Data
US 2012/0103664 A1  May 3, 2012

(30) Foreign Application Priority Data

Jun. 30, 2009  (AT) ..................... 409/2009

(51) Int. Cl.
  *H05K 1/09*   (2006.01)
  *H05K 1/03*   (2006.01)
  *H05K 1/02*   (2006.01)
  *H05K 3/34*   (2006.01)

(52) U.S. Cl.
  CPC ............. *H05K 1/02* (2013.01); *H05K 1/0298* (2013.01); *H05K 1/0373* (2013.01); *H05K 3/3452* (2013.01); *H05K 2201/012* (2013.01); *H05K 2201/0209* (2013.01); *H05K 2201/0989* (2013.01); *H05K 2201/09309* (2013.01)

(58) Field of Classification Search
  CPC .................................... H05K 1/0207
  USPC ......................... 174/251, 255, 257
  See application file for complete search history.

(56) References Cited

U.S. PATENT DOCUMENTS 4,775,573 A * 10/1988 Turek ........................... 174/254
5,079,069 A *  1/1992 Howard et al. ............... 361/748
(Continued)

FOREIGN PATENT DOCUMENTS

GB    2259812    3/1993
WO    2007/059152    5/2007

*Primary Examiner* — Chau N Nguyen
*Assistant Examiner* — Roshn Varghese
(74) *Attorney, Agent, or Firm* — Jacobson Holman, PLLC

(57) ABSTRACT

In the case of a multilayered printed circuit board (20), more particularly a flame-resistant and/or smoke-suppressing multilayered printed circuit board, consisting of a plurality of interconnected layers (2, 3, 12, 13) composed of incombustible, conductive material and layers (1, 11) composed of non-conductive material, two layers (2, 3, 12) composed of a conductive material in each case being separated by at least one layer (1, 11) composed of a non-conductive material, it is provided that the printed circuit board (20) contains in its interior at least two layers (2, 3, 12) having a surface proportion of at least 50%, more particularly at last 70%, composed of the incombustible, conductive material, as a result of which a multilayered printed circuit board (20) having improved flame resistance and reduced smoke evolution can be made available.

14 Claims, 1 Drawing Sheet

(56) References Cited

U.S. PATENT DOCUMENTS

Figure 1:
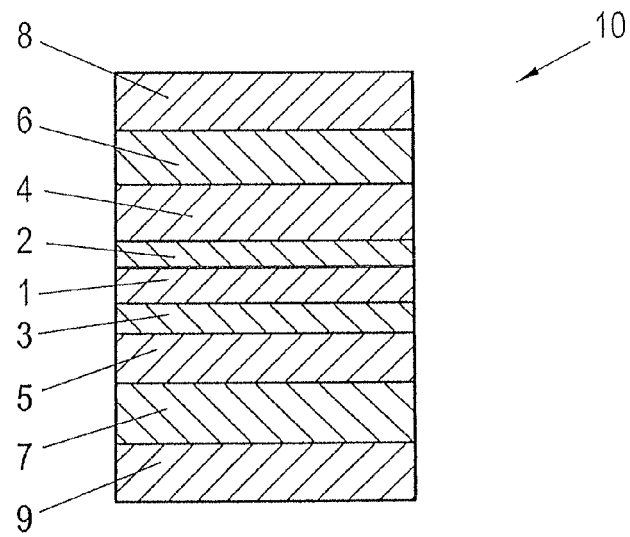

| 6,132,853 A | 10/2000 | Noddin |
| 2003/0029830 A1 | 2/2003 | Takaya |
| 2004/0018348 A1* | 1/2004 | Saito .............................. 174/258 |
| 2008/0190646 A1* | 8/2008 | Folts et al. ................. 174/125.1 |
| 2010/0132993 A1* | 6/2010 | Nakamura et al. ............ 174/260 |
| 2010/0263914 A1* | 10/2010 | Yao et al. ...................... 174/250 |

* cited by examiner

MULTILAYERED PRINTED CIRCUIT BOARD, MORE PARTICULARLY FLAME-RESISTANT AND/OR SMOKE-SUPPRESSING MULTILAYERED PRINTED CIRCUIT BOARD

This is national stage of PCT/AT2010/000233 filed Jun. 25, 2010 and published in German, which has priority of Austria no. GM 409/2009 filed Jun. 30, 2009, hereby incorporated by reference.

FIELD OF THE INVENTION

The present invention relates to a multilayered printed circuit board, more particularly a flame-resistant and/or smoke-suppressing multilayered printed circuit board, consisting of a plurality of interconnected layers composed of incombustible, conductive material and layers composed of non-conductive material, two layers composed of conductive material in each case being separated by at least one layer composed of non-conductive material, wherein the printed circuit board contains in its interior at least two layers having a surface proportion of at least 50%, more particularly at least 70%, composed of the incombustible, conductive material.

PRIOR ART

A multilayered substrate similar to the kind mentioned above can be taken from US 2003/0029830 A1, for instance, aiming at providing multilayered substrates with reduced thickness and maintaining a sufficient, in particular mechanical strength during handling.

Moreover, from WO 2007/059152 there is known a glue for a particularly multilayered material for printed circuit boards, aiming at improved features, in particular for usage under conditions of high or raised temperature and humidity.

Depending on the purposes of application or use of multilayer printed circuit boards, such printed circuit boards must not only meet respective mechanical and, in particular, electrical checking and/or safety requirements. As a rule, also additional tests are prescribed for such printed circuit boards, in particular, when used in special environments or for special purposes. Thus, a so-called "smoke density test" is, for instance, inter alia prescribed for the use of materials in the aircraft industry, to which substantially all materials used in the aircraft industry are subjected, wherein optionally different requirements have to be fulfilled in such a test as a function of the purpose of use.

For the use of printed circuit boards in the aircraft industry, it is, for instance, prescribed in the context of the above-mentioned smoke density test that the development of smoke through such a printed circuit board in a predetermined test volume at externally applied elevated temperatures, and/or the direct exposure to a flame for a time of 240 s, shall result in a maximum specific optical density of below 200. In such a test, a sample having the dimensions of, for instance, 75 mm×75 mm is received in a suitable holder, wherein, after having shielded predetermined side faces, a surface substantially having the cited dimensions is exposed either to an elevated temperature or directly to the defined action of a flame.

Hitherto known constructions and structures of multilayer printed circuit boards have involved the problem of containing comparatively high portions of usually highly combustible, non-conductive materials generally constituting such multilayer printed circuit boards.

SUMMARY OF THE INVENTION

The present invention, therefore, aims to provide a multilayered printed circuit board of the initially defined kind, more particularly a flame-resistant and/or smoke-suppressing multilayered printed circuit board, which is suitable for special purposes of use and is, in particular, able to reliably comply with the requirements of the above-mentioned smoke density test in order to enable the use of such multilayered printed circuit boards, for instance, in the aircraft industry.

To solve these objects, a multilayered printed circuit board of the initially defined kind is essentially characterized in that a solder mask is each additionally provided on outwardly facing layers being composed of the incombustible, conductive material. Due to the fact that the printed circuit board contains in its interior at least two layers each having a high surface portion of at least 50%, more particularly at least 70%, composed of the incombustible, conductive material, it will be ensured that in the event of both an exposure to elevated temperatures and, as the case may be, the direct exposure to a flame or fire, only partial regions of such a printed circuit board will possibly be destroyed or damaged, particularly under the development of smoke due to the non-conductive, resin-like materials usually contained in such a multilayer printed circuit board, while the complete destruction of the printed circuit board over the required test period of, for instance, 4 minutes will, in particular, be largely prevented also reducing or minimizing smoke development. The high surface portion of layers composed of incombustible, conductive and hence, in particular, metallic materials, which are disposed in the interior of the printed circuit board, ensures that the requirements in respect to an accordingly slight smoke development will be reliably met. To further improve the flame resistance, particularly of the outwardly facing surfaces it is proposed for the printed circuit board according to the invention that a solder mask is each additionally provided on the outwardly facing layers composed of the incombustible, conductive material.

In order to enhance the desired reduction or minimization of the smoke emerging in case of fire, it is proposed according to a preferred embodiment that the layers composed of the incombustible, conductive material in the interior of the printed circuit board are separated by at least one layer composed of a non-conductive material, particularly dielectric, having a maximum thickness of 250 μm and, in particular, 150 μm. By limiting in this manner the maximum thickness of the layer(s) or ply/plies composed of a non-conductive material, particularly dielectric, which, with the materials usually used in the production of printed circuit boards and consisting of resins, synthetic materials or the like, usually exhibits high flammability and, in particular, smoke development, it is safeguarded that the requirements of such additional tests for special purposes of use will be met by the simultaneous presence of layers composed of incombustible, conductive material and covering comparatively high surface portions.

To further improve the flame resistance and/or reduction of emerging smoke or smoke gas, it is proposed according to a further preferred embodiment that the printed circuit board, on its surfaces facing the outside, includes layers each comprising a surface portion of at least 15%, particularly at least 40%, of the incombustible, conductive material. Such portions or surface portions of incombustible, conductive material on the multilayer printed circuit board surface facing the outside will, in particular, prevent the rapid onset of a damage or destruction of a printed circuit board according to the invention on account of the large-surface portions of incombustible, conductive material also facing the outside, in order to further improve the flame resistance and/or the chance of suppressing or minimizing smoke development.

A particularly good flame resistance or protective effect of the outwardly facing surface of a multilayer printed circuit board according to the invention will be achieved in that the surface portion of the incombustible, conductive material of the outwardly facing layer is larger than the surface portion of the solder mask, as in correspondence with a further preferred embodiment of the printed circuit board according to the invention.

In order to make more difficult, or impede, the burning-through of the printed circuit board according to the invention, or the simple penetration of flames through a printed circuit board usually having a comparatively small thickness, it is proposed according to a further preferred embodiment that partial regions of incombustible, conductive material of individual layers, which are each separated by at least one layer of non-conductive material, are formed or arranged in a mutually offset and/or, in particular, at least partially overlapping manner, seen in a top view of the multilayer printed circuit board. Such an offset and/or at least partially overlapping arrangement of partial regions of the individual layers composed of incombustible, conductive material will further enhance the resistance of the printed circuit board according to the invention to the action of flames even on more deeply disposed multilayer printed circuit board layers or plies that are, in particular, composed of non-conductive and usually (more) readily combustible material, since, in particular, the burning through several layers of such a multilayer printed circuit board in the manner of a stack effect will be counteracted by avoiding the formation of a passage opening extending, in particular, through several layers.

In order to attain the electrical conductivity required in the context of the production of a multilayer printed circuit when patterning such a multilayer printed circuit board, in addition to the flame resistance and/or smoke suppression sought by the invention, it is proposed according to a further preferred embodiment that the layer(s) composed of the incombustible, conductive material is/are each formed by a copper layer.

Particularly when using copper for the incombustible, conductive material, which comprises a high conductivity, and in order to reduce the costs involved in the production of a multilayer printed circuit board according to the invention, it is moreover proposed that the thickness of the layers composed of incombustible, conductive material is smaller than the thickness of the at least one layer composed of non-conductive material, as in correspondence with a further preferred embodiment of the printed circuit board according to the invention.

In addition to the arrangement proposed by the invention, of layers or plies of incombustible, conductive material with an accordingly large surface portion in order to improve or increase the flame resistance and/or reduce or suppress the smoke development, the invention also aims to accordingly improve the flammability or combustibility and smoke-developing property of non-conductive materials, particularly dielectrics, usually employed in the production of a multilayer printed circuit board. In this context, it is proposed according to a further preferred embodiment that flame-retardant and/or smoke-suppressing fillers such as, e.g., $Al(OH)_3 SiO_2$ and the like are added to the layer(s) composed of the non-conductive material, and/or a layer composed of a non-conductive material is covered by a flame-resistant layer, e.g. a polyimide layer. By using such fillers or additives, and/or covering with flame-retardant materials, the flame-resistance of the multilayer printed circuit board according to the invention will be further improved, thus enabling the requirements of, for instance, the initially mentioned smoke density tests to be met in an accordingly simpler and more reliable manner. A successful test can thus also be achieved with multilayer printed circuit boards which, due to the increasing complexity of the structures of such multilayer printed circuit boards, are provided or formed with accordingly higher portions of layers or plies and, in particular, layers composed of non-conductive materials to be inserted between successive layers of conductive material.

In order to provide multilayer printed circuit boards that will reliably fulfil a test for special purposes of use, e.g. the initially mentioned smoke density test, it is proposed according to a further preferred embodiment that the number of layers composed of non-conductive material is less than 7 and, in particular, less than 5.

In addition to the fact that, as pointed out above, the conditions of the initially mentioned smoke density test will be reliably met by the measures proposed according to the invention, to use layers or plies composed of incombustible, conductive material with comparatively large surface portions, and to accordingly use intermediate layers or plies composed of non-conductive material, it will be feasible according to the invention to provide multilayer printed circuit boards even having large thicknesses as compared to known multilayer printed circuit boards. In the context of the present invention, it is proposed in this respect that the maximum overall thickness of the multilayer printed circuit board is 1.25 mm and, in particular, 1 mm, as in correspondence with a further preferred embodiment of the printed circuit board according to the invention.

In order to meet the criteria of the initially mentioned smoke density test while, in particular, using layers or plies having accordingly large surface portions of incombustible, conductive material, it is proposed according to a further preferred embodiment of the invention that the volume portion of layers composed of the incombustible, conductive material is at least 8% by volume, in particular at least 12% by volume, of the multilayer printed circuit board.

SHORT DESCRIPTION OF THE DRAWINGS

In the following, the invention will be explained in more detail by way of exemplary embodiments schematically illustrated in the accompanying drawing, with a plurality of exemplary embodiments and comparative examples relating to the set-ups or structures of multilayer printed circuit boards according to the invention being indicated in addition.

Figure 2:
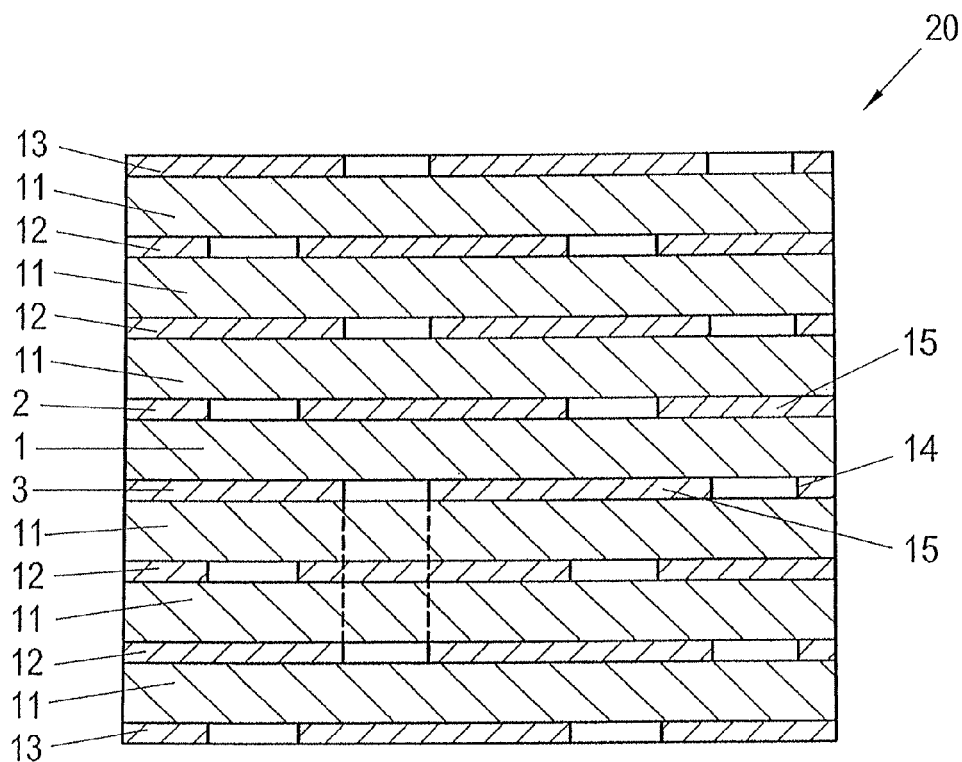

FIG. 1 is a schematic partial view through a first embodiment of a multilayer printed circuit board according to the invention; and FIG. 2, in an illustration similar to that of FIG. 1, likewise depicts a schematic section through a modified embodiment of a multilayer printed circuit board according to the invention having an increased number of layers or plies.

DETAILED DESCRIPTION OF PREFERRED EMBODIMENTS

From the schematic section through a multilayer printed circuit board of a first embodiment according to FIG. 1, it is apparent that, on a core 1, which in the production of multilayer printed circuit boards is, for instance, comprised of a hardened or cured resin material, layers 2, composed of an incombustible, conductive material are disposed, said layers 2, 3 in the illustration according to FIG. 1 being shown as substantially full-surface layers.

Layers 4, 5 composed of a non-conductive material, in particular dielectric material, are provided consecutively to the layers 2, 3 of incombustible, conductive material.

On the outwardly facing surfaces of the multilayer printed circuit board generally denoted by 10, layers or plies 6, 7 composed of an incombustible, conductive material are again disposed to adjoin layers 4, 5, wherein no patterning, which is usually provided on such printed circuit boards at last for the externally arranged layers 6, 7 of conductive material, is shown in detail in the schematic illustration according to FIG. 1.

Additional layers 8, 9 are, moreover, provided as solder masks, wherein the overall surface portion of the solder masks 8, 9 in the finished printed circuit board does not exceed the surface portion of the layers or plies 6, 7 of incombustible, conductive material arranged or adjoining immediately therebelow.

In respect to the illustration according to FIG. 1, it is noted that the thicknesses of the individual layers or plies 1 to 9 are not depicted true to scale, examples of such thicknesses of individual layers or plies being, in particular, apparent from the examples according to Table 1.

In the illustrations according to FIGS. 1 and 2, no further components, devices or the like of such a multilayer printed circuit board are, moreover, illustrated for the sake of simplicity.

In the modified exemplary embodiment of a multilayer printed circuit board 20 schematically illustrated in FIG. 2, a core 1 on which layers or plies 2, 3 of incombustible, conductive material, in particular copper, are disposed is again visible.

In the structure of a multilayer printed circuit board 20 illustrated in FIG. 2, it can, moreover, be seen that a plurality of layers or plies each denoted by 11 and composed of a non-conductive material, in particular a dielectric such as PP (polypropylene), are provided or consecutively arranged, between which layers each denoted by 12 and composed of an incombustible, conductive material, in particular copper, are disposed. In addition, layers or plies 13 composed of an incombustible, conductive material, in particular copper, are again provided on the outwardly facing surfaces of the multilayer printed circuit board 20.

In connection with the illustration according to FIG. 2, it is noted again that the thicknesses of the individual layers or plies of this exemplary embodiment are not depicted true to scale. Regarding possible embodiments or thicknesses and arrangements of such layers, it is again referred to the Examples indicated in Table 1.

From the illustration according to FIG. 2, it is moreover apparent that the layers or plies 2, 3 as well as 12 and 13, which are each composed of an incombustible, conductive material, in particular copper, are formed with a plurality of passages 14, wherein interposed partial regions 15 are each disposed in a mutually offset manner between the individual passages, and passages 14 of a layer or ply are overlapped by respective regions or partial regions 15 composed of incombustible, conductive material. In this manner, the simple burning-through of the layers 11 as well as the core 1 of non-conductive material, which is usually highly combustible, will, in particular, be prevented such that the flame resistance of the multilayer printed circuit board 20, or its ability to retard or suppress the development of smoke, will be accordingly improved.

As is more clearly apparent from the exemplary embodiments indicated in detail in Table 1, the layers 4, 5 or 11 of non-conductive material are at least partially supplemented with a filler material for improving the flame resistance and suppressing the smoke development. Further layers of a flame-resistant material such as polyimide (PI), having in particular accordingly reduced thicknesses, may be provided alternatively or in addition.

In connection with the illustration of FIG. 2, at least individual layers 12 of incombustible, conductive material may, furthermore, be omitted or removed, as is, for instance, indicated in Examples 5 and 11.

In respect to the following Tables 1 and 2, it is initially noted that Table 1 specifies a plurality of different structures of the multilayer printed circuit board 10 or 20 based, in particular, on the schematic illustrations according to FIGS. 1 and 2. The individual Examples 1 to 17 primarily differ by the number of the respectively used layers or plies both of conductive, incombustible material and of non-conductive material, particularly dielectric material. In addition, different set-ups or structures with, in particular, respectively different surface or area portions of both the layers or plies of incombustible, conductive material contained in the interior and, in particular, the layers or plies facing the outer surface can be seen.

In Table 2, several comparative examples are moreover listed, wherein a plurality of layers or plies of multilayer printed circuit boards are again each indicated for respectively different structures or set-ups using, in particular, materials for the individual layers or plies, which correspond to those of Examples 1 to 17, wherein, however, the requirements for the initially mentioned smoke density test are not met by these comparative examples.

TABLE 1

| Example 1 Structure 1.1_15 Filler: SiO2 | | | | Example 2 Structure 1.2_50 Filler: AlOH3 | | | | Example 3 Structure 1.3_50 Filler: AlOH3 | | | |
|---|---|---|---|---|---|---|---|---|---|---|---|
| Structure | Thickness ($\mu$m) | Surface portion | Rel. vol. | Structure | Thickness ($\mu$m) | Surface portion | Rel. vol. | Structure | Thickness ($\mu$m) | Surface portion | Rel. vol. |
| Cu | 16.51 | 0.5 | 8.255 | Cu | 17.33 | 0.5 | 8.665 | Cu | 18.16 | 0.5 | 9.08 |
| PP | 66.04 | 1 | 66.04 | PP | 80.89 | 1 | 80.89 | PP | 83.37 | 1 | 83.37 |
| Cu | 15.68 | 1 | 15.68 | Cu | 18.16 | 1 | 18.16 | Cu | 17.33 | 1 | 17.33 |
| core | 78.42 | 1 | 78.42 | core | 78.42 | 1 | 78.42 | core | 75.12 | 1 | 75.12 |
| Cu | 16.51 | 1 | 16.51 | Cu | 16.51 | 1 | 16.51 | Cu | 17.33 | 1 | 17.33 |
| PP | 66.04 | 1 | 66.04 | PP | 80.89 | 1 | 80.89 | PP | 82.55 | 1 | 82.55 |
| Cu | 17.33 | 0.5 | 8.665 | Cu | 18.16 | 0.5 | 9.08 | Cu | 18.16 | 0.5 | 9.08 |

TABLE 1-continued

|  |  |  |  |  |  |  |
|---|---|---|---|---|---|---|
| Cu [μm] | 66.03 | 49.11 | 70.16 | 52.415 | 70.98 | 52.82 |
| PP [μm] | 210.5 | 210.5 | 240.2 | 240.2 | 241.04 | 241.04 |
| Total | 276.53 | 259.61 | 310.36 | 292.615 | 312.02 | 293.86 |
| Cu [%] | 23.9 | 18.9 | 22.6 | 17.9 | 22.7 | 18.0 |
| PP [%] | 76.1 | 81.1 | 77.4 | 82.1 | 77.3 | 82.0 |
| (Ds ~20) [s] | 185 |  | 195.0 |  | 210.0 |  |
| Dm (within 240 s) | 35 |  | 28.0 |  | 34.0 |  |

| | Example 4 Structure 2.0_50 Filler: AlOH3 ||| Example 5 Structure 3.0_50 Filler: AlOH3 + PI layer ||| Example 6 Structure 4.0_50 Solder mask on outer surface |||
|---|---|---|---|---|---|---|---|---|---|
| | Structure | Thickness (μm) | Surface portion | Rel. vol. | Structure | Thickness (μm) | Surface portion | Rel. vol. | Structure | Thickness (μm) | Surface portion | Rel. vol. |

| | Structure | Thickness (μm) | Surface portion | Rel. vol. | Structure | Thickness (μm) | Surface portion | Rel. vol. | Structure | Thickness (μm) | Surface portion | Rel. vol. |
|---|---|---|---|---|---|---|---|---|---|---|---|---|
|  | Cu | 18.26 | 0.5 | 9.13 | Cu | 30.92 | 0.5 | 15.46 | Cu | 17.33 | 0.5 | 8.665 |
|  | PP | 267 | 1 | 267 | RCC | 28.99 | 1 | 28.99 | PP | 76.77 | 1 | 76.77 |
|  | Cu | 18.24 | 1 | 18.24 | PI | 46.38 | 1 | 46.38 | Cu | 16.51 | 1 | 16.51 |
|  | core | 72.97 | 1 | 72.97 | PP | 81.17 | 1 | 81.17 | core | 76.77 | 1 | 76.77 |
|  | Cu | 19.9 | 1 | 19.9 | Cu | 17.39 | 1 | 17.39 | Cu | 18.16 | 1 | 18.16 |
|  | PP | 255.39 | 1 | 255.39 | core | 79.24 | 1 | 79.24 | PP | 76.77 | 1 | 76.77 |
|  | Cu | 18.24 | 0.5 | 9.12 | Cu | 17.39 | 1 | 17.39 | Cu | 17.33 | 0.5 | 8.665 |
|  |  |  |  |  | PP | 81.17 | 1 | 81.17 |  |  |  |  |
|  |  |  |  |  | PI | 46.38 | 1 | 46.38 |  |  |  |  |
|  |  |  |  |  | RCC | 28.99 | 1 | 28.99 |  |  |  |  |
|  |  |  |  |  | Cu | 30.92 | 0.5 | 15.46 |  |  |  |  |
| Cu [μm] |  | 74.64 |  | 56.39 |  | 96.62 |  | 65.7 |  | 69.33 |  | 52 |
| PP [μm] |  | 595.36 |  | 595.36 |  | 392.32 |  | 392.32 |  | 230.31 |  | 230.31 |
| Total |  | 670 |  | 651.75 |  | 488.94 |  | 458.02 |  | 299.64 |  | 282.31 |
| Cu [%] |  | 11.1 |  | 8.7 |  | 19.8 |  | 14.3 |  | 23.1 |  | 18.4 |
| PP [%] |  | 88.9 |  | 91.3 |  | 80.2 |  | 85.7 |  | 76.9 |  | 81.6 |
| (Ds ~20) [s] |  | 170.00 |  |  |  | 165.00 |  |  |  | 175.0 |  |  |
| Dm (within 240 s) |  | 47.00 |  |  |  | 49.0 |  |  |  | 31.0 |  |  |

| | Example 7 Structure 1.1_15 Filler: SiO2 ||| Example 8 Structure 1.2_15 Filler: AlOH3 ||| Example 9 Structure 1.3_15 Filler: AlOH3 |||
|---|---|---|---|---|---|---|---|---|---|---|---|---|
|  | Structure | Thickness (μm) | Surface portion | Rel. vol. | Structure | Thickness (μm) | Surface portion | Rel. vol. | Structure | Thickness (μm) | Surface portion | Rel. vol. |
|  | Cu | 16.51 | 0.15 | 2.4765 | Cu | 17.33 | 0.15 | 2.5995 | Cu | 18.16 | 0.15 | 2.724 |
|  | PP | 66.04 | 1 | 66.04 | PP | 80.89 | 1 | 80.89 | PP | 83.37 | 1 | 83.37 |
|  | Cu | 15.68 | 1 | 15.68 | Cu | 18.16 | 1 | 18.16 | Cu | 17.33 | 1 | 17.33 |
|  | core | 78.42 | 1 | 78.42 | core | 78.42 | 1 | 78.42 | core | 75.12 | 1 | 75.12 |
|  | Cu | 16.51 | 1 | 16.51 | Cu | 16.51 | 1 | 16.51 | Cu | 17.33 | 1 | 17.33 |
|  | PP | 66.04 | 1 | 66.04 | PP | 80.89 | 1 | 80.89 | PP | 82.55 | 1 | 82.55 |
|  | Cu | 17.33 | 0.15 | 2.5995 | Cu | 18.16 | 0.15 | 2.724 | Cu | 18.16 | 0.15 | 2.724 |
| Cu [μm] |  | 66.03 |  | 37.266 |  | 70.16 |  | 39.9935 |  | 70.98 |  | 40.108 |
| PP [μm] |  | 210.5 |  | 210.5 |  | 240.2 |  | 240.2 |  | 241.04 |  | 241.04 |
| Total |  | 276.53 |  | 247.766 |  | 310.36 |  | 280.1935 |  | 312.02 |  | 281.148 |
| Cu [%] |  | 23.9 |  | 15.0 |  | 22.6 |  | 14.3 |  | 22.7 |  | 14.3 |
| PP [%] |  | 76.1 |  | 85.0 |  | 77.4 |  | 85.7 |  | 77.3 |  | 85.7 |
| mode (Ds ~20) [s] |  | 75 |  |  |  | 160.0 |  |  |  | 140.0 |  |  |
| Dm (within 240 s) |  | 46 |  |  |  | 28.0 |  |  |  | 38.0 |  |  |

| | Example 10 Structure 2.0_15 Filler: AlOH3 ||| Example 11 Structure 3.0_15 Filler: AlOH3 + PI layer ||| Example 12 Structure 4.0_1 5 Solder mask on outer surface |||
|---|---|---|---|---|---|---|---|---|---|---|---|---|
|  | Structure | Thickness (μm) | Surface portion | Rel. vol. | Structure | Thickness (μm) | Surface portion | Rel. vol. | Structure | Thickness (μm) | Surface portion | Rel. vol. |
|  | Cu | 18.26 | 0.15 | 2.739 | Cu | 30.92 | 0.15 | 4.638 | Cu | 17.33 | 0.15 | 2.5995 |
|  | PP | 181.2 | 1 | 181.2 | RCC | 28.99 | 1 | 28.99 | PP | 76.77 | 1 | 76.77 |
|  | Cu | 18.24 | 1 | 18.24 | PI | 46.38 | 1 | 46.38 | Cu | 16.51 | 1 | 16.51 |
|  | core | 72.97 | 1 | 72.97 | PP | 81.17 | 1 | 81.17 | core | 76.77 | 1 | 76.77 |
|  | Cu | 19.9 | 1 | 19.9 | Cu | 17.39 | 1 | 17.39 | Cu | 18.16 | 1 | 18.16 |
|  | PP | 179.5 | 1 | 179.5 | core | 79.24 | 1 | 79.24 | PP | 76.77 | 1 | 76.77 |
|  | Cu | 18.24 | 0.15 | 2.736 | Cu | 17.39 | 1 | 17.39 | Cu | 17.33 | 0.15 | 2.5995 |
|  |  |  |  |  | PP | 81.17 | 1 | 81.17 |  |  |  |  |
|  |  |  |  |  | PI | 46.38 | 1 | 46.38 |  |  |  |  |
|  |  |  |  |  | RCC | 28.99 | 1 | 28.99 |  |  |  |  |
|  |  |  |  |  | Cu | 30.92 | 0.15 | 4.638 |  |  |  |  |

TABLE 1-continued

|  |  |  |  |  |  |  |
|---|---|---|---|---|---|---|
| Cu [μm] | 74.64 | 43.615 | 96.62 | 44.056 | 69.33 | 39.869 |
| PP [μm] | 433.67 | 433.67 | 392.32 | 392.32 | 230.31 | 230.31 |
| Total | 508.31 | 477.285 | 488.94 | 436.376 | 299.64 | 270.179 |
| Cu [%] | 14.7 | 9.1 | 19.8 | 10.1 | 23.1 | 14.8 |
| PP [%] | 85.3 | 90.9 | 80.2 | 89.9 | 76.9 | 85.2 |
| (Ds ~20 [s] | 100.0 |  | 75.0 |  | 185.0 |  |
| Dm (within 240 s) | 100.0 |  | 77.0 |  | 35.0 |  |

| | Example 13 Structure 5.0_50 Filler: AlOH3 | | | Example 14 Structure 5.0_15 Filler: AlOH3 | | | Example 15 Structure 6.0_15 Filler: AlOH3 | | |
|---|---|---|---|---|---|---|---|---|---|
| | Structure | Thickness (μm) | Surface portion | Rel. vol. | Structure | Thickness (μm) | Surface portion | Rel. vol. | Structure | Thickness (μm) | Surface portion | Rel. vol. |

| | Structure | Thickness (μm) | Surface portion | Rel. vol. | Structure | Thickness (μm) | Surface portion | Rel. vol. | Structure | Thickness (μm) | Surface portion | Rel. vol. |
|---|---|---|---|---|---|---|---|---|---|---|---|---|
|  | Cu | 17.33 | 0.5 | 8.665 | Cu | 17.33 | 0.15 | 2.5995 | Cu | 17.33 | 0.15 | 2.5995 |
|  | PP | 80.89 | 1 | 80.89 | PP | 80.89 | 1 | 80.89 | PP | 80.89 | 1 | 80.89 |
|  | Cu | 18.16 | 0.5 | 9.08 | Cu | 18.16 | 0.5 | 9.08 | Cu | 18.16 | 0.65 | 11.804 |
|  | core | 78.42 | 1 | 78.42 | core | 78.42 | 1 | 78.42 | core | 78.42 | 1 | 78.42 |
|  | Cu | 16.51 | 0.5 | 8.255 | Cu | 16.51 | 0.5 | 8.255 | Cu | 16.51 | 0.65 | 10.7315 |
|  | PP | 80.89 | 1 | 80.89 | PP | 80.89 | 1 | 80.89 | PP | 80.89 | 1 | 80.89 |
|  | Cu | 18.16 | 0.5 | 9.08 | Cu | 18.16 | 0.15 | 2.724 | Cu | 18.16 | 0.15 | 2.724 |
| Cu [μm] |  | 70.16 |  | 35.08 |  | 70.16 |  | 22.6585 |  | 70.16 |  | 27.859 |
| PP [μm] |  | 240.2 |  | 240.2 |  | 240.2 |  | 240.2 |  | 240.2 |  | 240.2 |
| Total |  | 310.36 |  | 275.28 |  | 310.36 |  | 262.8585 |  | 310.36 |  | 268.059 |
| Cu [%] |  | 22.6 |  | 12.7 |  | 22.6 |  | 8.6 |  | 22.6 |  | 10.4 |
| PP [%] |  | 77.4 |  | 87.3 |  | 77.4 |  | 91.4 |  | 77.4 |  | 89.6 |
| (DS ~20 [s] |  | 135.0 |  |  |  | 98.0 |  |  |  | 110.0 |  |  |
| DM (within 240 s) |  | 47.0 |  |  |  | 121.0 |  |  |  | 77.0 |  |  |

| | Example 16 Structure 7.0_15 Filler: AlOH3 | | | Example 17 Structure 7.0_50 Filler: AlOH3. | | | |
|---|---|---|---|---|---|---|---|

| | Structure | Thickness (μm) | Surface portion | Rel. vol. | Structure | Thickness (μm) | Surface portion | Rel. vol. |
|---|---|---|---|---|---|---|---|---|
|  | Cu | 17.33 | 0.15 | 2.5995 | Cu | 17.33 | 0.5 | 8.665 |
|  | pp | 80.89 | 1 | 80.89 | PP | 80.89 | 1 | 80.89 |
|  | Cu | 18.16 | 0.85 | 15.436 | Cu | 18.16 | 0.85 | 15.436 |
|  | core | 78.42 | 1 | 78.42 | core | 78.42 | 1 | 78.42 |
|  | Cu | 16.51 | 0.85 | 14.0335 | Cu | 16.51 | 0.85 | 14.0335 |
|  | PP | 80.89 | 1 | 80.89 | PP | 80.89 | 1 | 80.89 |
|  | Cu | 18.16 | 0.15 | 2.724 | Cu | 18.16 | 0.5 | 9.08 |
| Cu [%] |  | 70.16 |  | 34.793 |  | 70.16 |  | 47.2145 |
| PP [%] |  | 240.2 |  | 240.2 |  | 240.2 |  | 240.2 |
| Total |  | 310.36 |  | 274.993 |  | 310.36 |  | 287.4145 |
| Cu [%] |  | 22.6 |  | 12.7 |  | 22.6 |  | 16.4 |
| PP [%] |  | 77.4 |  | 87.3 |  | 77.4 |  | 83.6 |
| (DS ~20 [s] |  | 130.0 |  |  |  | 172.0 |  |  |
| DM (within 240 s) |  | 50.0 |  |  |  | 32.0 |  |  |

Ds: specific optical density of smoke. Time until reaching a value of Ds ~20
Dm: maximum specific optical density of smoke in smoke density test (maximum admissible value Dm = 200 after 240 seconds)

TABLE 2

| | Comparative Example 1 Structure SBE0954 | | | Comparative Example 2 Structure SOF1002 | | | Comparative Example 3 Structure STC5763 | | |
|---|---|---|---|---|---|---|---|---|---|

| | Structure | Thickness (μm) | Surface portion | Rel. vol. | Structure | Thickness (μm) | Surface portion | Rel. vol. | Structure | Thickness (μm) | Surface portion | Rel. vol. |
|---|---|---|---|---|---|---|---|---|---|---|---|---|
|  | Cu | 5 | 0.3 | 1.5 | Cu | 5 | 0.7 | 3.5 | Cu | 5 | 0.2 | 1 |
|  | PP | 200 | 1 | 200 | PP | 50 | 1 | 50 | PP | 50 | 1 | 50 |
|  | Cu | 18 | 0.95 | 17.1 | Cu | 35 | 0.2 | 7 | Cu | 18 | 0.1 | 1.8 |
|  | core | 200 | 1 | 200 | core | 250 | 1 | 250 | PP | 50 | 1 | 50 |
|  | Cu | 18 | 0.4 | 7.2 | Cu | 35 | 0.4 | 14 | Cu | 34 | 0.9 | 30.6 |
|  | PP | 150 | 1 | 150 | PP | 120 | 1 | 120 | core | 1200 | 1 | 1200 |
|  | PP | 200 | 1 | 200 | PP | 120 | 1 | 120 | Cu | 34 | 0.9 | 30.6 |
|  | PP | 200 | 1 | 200 | Cu | 35 | 0.7 | 24.5 | PP | 50 | 1 | 50 |
|  | PP | 150 | 1 | 150 | core | 100 | 1 | 100 | Cu | 18 | 0.2 | 3.6 |
|  | Cu | 18 | 0.25 | 4.5 | Cu | 35 | 0.7 | 24.5 | PP | 50 | 1 | 50 |
|  | core | 200 | 1 | 200 | PP | 120 | 1 | 120 | Cu | 5 | 0.3 | 1.5 |

TABLE 2-continued

| | Comparative Example 1 Structure SBE0954 | | | | Comparative Example 2 Structure SOF1002 | | | | Comparative Example 3 Structure STC5763 | | | |
|---|---|---|---|---|---|---|---|---|---|---|---|---|
| | Structure | Thickness (μm) | Surface portion | Rel. vol. | Structure | Thickness (μm) | Surface portion | Rel. vol. | Structure | Thickness (μm) | Surface portion | Rel. vol. |
| | Cu | 18 | 0.95 | 17.1 | PP | 120 | 1 | 120 | | | | |
| | PP | 200 | 1 | 200 | Cu | 35 | 0.5 | 17.5 | | | | |
| | Cu | 5 | 0.6 | 3 | core | 250 | 1 | 250 | | | | |
| | | | | | Cu | 35 | 0.2 | 7 | | | | |
| | | | | | PP | 50 | 1 | 50 | | | | |
| | | | | | Cu | 5 | 0.4 | 2 | | | | |
| Cu [μm] | | 82 | | 50.4 | | 220 | | 100 | | 114 | | 69.1 |
| PP [μm] | | 1500 | | 1500 | | 1180 | | 1180 | | 1400 | | 1400 |
| Total | | 1582 | | 1550.4 | | 1400 | | 1280 | | 1514 | | 1469.1 |
| Cu [%] | | 5.2 | | 3.3 | | 15.7 | | 7.8 | | 7.5 | | 4.7 |
| PP [%] | | 94.8 | | 96.7 | | 84.3 | | 92.2 | | 92.5 | | 95.3 |
| (DS ~20 [s]) | | 90 | | | | 45 | | | | 105 | | |
| Dm (within 240 s) | | 660 | | | | 660 | | | | 340 | | |

From Table 1, it is apparent that fillers of the respectively indicated type are contained in at least one layer of a non-conductive material, particularly dielectric, more particularly polypropylene (PP), in a plurality of the indicated examples.

For Examples 5 and 11, it is, moreover, indicated that an additional layer or ply of a flame-resistant material such as, e.g., PI (polyimide) is provided.

While for Examples 1 to 12, the layers provided in the interior, which are each composed of an incombustible, conductive material indicated as Cu (copper) in each of the exemplary embodiments, are substantially formed all over the surface with a surface portion of 1 or 100%, it is apparent that for Examples 13 to 17 a surface portion of at least 50% (0.5) and, in particular, 70% also readily fulfils the requirements of the initially mentioned smoke density test, namely a maximum optical smoke density Dm of 200 within 240 seconds.

It is, moreover, apparent that, for the surface or area portion of the respectively outwardly oriented layers or plies, the requirements of the smoke density test are already met from a surface or area portion of 0.15 or 15%, respectively. By increasing the surface portion of the outwardly oriented layers to at least 40% and, in particular, 50%, the results concerning smoke suppression and smoke development will be accordingly improved by a reduction of the Dm value within the pregiven 240 seconds.

It is further apparent from Table 1 that accordingly good test results will be obtained by using maximum layer thicknesses for the non-conductive material, particularly dielectric, of 250 μm, particularly 150 μm, said maximum thicknesses being, for instance, also fulfilled or observed for the structures of Example 5 and Example 11, where three layers or plies of non-conductive material are adjoiningly disposed.

When comparing the thicknesses of, in particular, the layers composed of non-conductive material with the structures used in the Comparative Examples according to Table 2, it is immediately apparent that, when using layers or plies of accordingly small thicknesses, particularly exceeding a thickness or overall thickness of 250 μm, as is repeatedly the case with Comparative Examples 1 to 3, the postulated limit values for Dm cannot be complied with.

From a comparison of the structures or set-ups according to Table 1 and Table 2, it is moreover apparent that the test requirements will not be fulfilled either, if a maximum thickness for the overall multilayer printed circuit board of 1.25 mm and, in particular, 1 mm is exceeded.

In addition, it is noticeable that, in order to meet the test requirements, the volume portion of incombustible, conductive material, particularly copper, amounts to at least 8% by volume. When further increasing the volume portion of incombustible, conductive material, particularly copper, to at least 12% by volume, the test results will be further improved, as can, for instance, be seen from Examples 1, 2, 3, 5, 6, 7, 8, 9, 12, 13, 16 and 17.

The time that is required for the different structures or set-ups according to Examples 1 to 17 and Comparative Examples 1, 2 and 3 to achieve a specific optical smoke density of 20 is, moreover, indicated in seconds both in Table 1 and in Table 2.

When comparing the individual results, it is apparent that, due to the quicker achievement of a Dm value of 20 when using structures or set-ups according to Comparative Examples 1 to 3, the test requirements for Dm will subsequently likewise not be observed or complied with.

From a comparison of the examples listed in Table 1 and comprising layers or plies having larger surface or area portions of incombustible, conductive material, in particular, in the interior of the multilayer printed circuit board 10 or 20, with the comparative examples listed in Table 2, in which structures of, in particular, presently known multilayer printed circuit boards have been examined, it is thus apparent that the flame-resistance, and the reduction or minimization of smoke development, sought for a successful completion of the initially mentioned smoke density test can be achieved by observing the parameters indicated above.

In the context of the substantially full-surface layers or plies of incombustible, conductive material (Cu) indicated in Examples 1 to 12 and, in particular, provided in the interior of the different structures or set-ups, it is noted that passages for contact connections or the like may, of course, be provided in such substantially full-surface layers or plies in a manner as illustrated and indicated in FIG. 2. Such passages having, as a rule, comparatively small cross sections or surface portions, a percentage of substantially or almost 100% will still result for such internally located layers or plies of incombustible, conductive material, particularly copper.

Such substantially full-surface layers can, in particular, be used for electromagnetic shielding effects in addition to providing an improved flame-resistance and suppression of smoke development.

The invention claimed is:

1. A flame-resistant or smoke-suppressing multilayered printed circuit board, comprising: an interior part comprising at least one first interior layer composed of non-conductive material being sandwiched between at least one second interior layer and at least one third interior layer both composed of an incombustible, conductive material, wherein each of the at least one second and third interior layers has a surface area of which at least 50% composed of the incombustible, conductive material, and wherein a flame-retardant or smoke-suppressing filler is added to the at least one first interior layer; an exterior part comprising a first exterior layer and a second exterior layer both composed of an incombustible, conductive material and parallelly opposing to each other, such that the interior part is sandwiched between the first exterior layer and the second exterior layer; a first solder mask and a second solder mask parallelly and directly connecting with the first exterior layer and second exterior layer, respectively, such that the interior part, the first exterior layer and the second exterior layer are sandwiched between the first solder mask and the second solder mask; wherein each of the first exterior layer and the second exterior layer comprises a surface area of at least 15% of the incombustible, conductive material; wherein the surface area of the incombustible, conductive material of each of the first exterior layer and the second exterior layer is larger than the surface portion of the first and second solder masks, respectively; wherein the incombustible, conductive material of the at least one second interior layer, the at least one third interior layer, the first exterior layer and the second exterior layer is copper; wherein the flame-retardant or smoke-suppressing filler is $Al(OH)_3$, $SiO_2$; wherein the at least one first interior layer composed of a non-conductive material comprises dielectric material, and/or, the at least one first interior layer composed of a non-conductive material is covered by a flame retardant layer; wherein the flame-resistant or smoke-suppressing multilayered printed circuit board meets a smoke density test, namely a maximum optical smoke density Dm of 200 within 240 seconds; and wherein the volume portion of layers composed of the incombustible, conductive material is at least 8% by volume of the multilayer printed circuit board.

2. The multilayered printed circuit board according to claim 1, wherein the at least one first interior layer composed of a non-conductive material comprises dielectric material and has a maximum thickness of 250 µm.

3. The multilayered printed circuit board according to claim 2, wherein the at least one first layer has a maximum thickness of 150 µm.

4. The multilayered printed circuit board according to claim 1, wherein each of the first exterior layer and the second exterior layer comprises a surface area of at least 40% of the incombustible, conductive material.

5. The multilayered printed circuit board according to claim 1, wherein partial regions of incombustible, conductive material of the at least one second interior layer and the at least one third interior layer, which are each separated by at least one first interior layer of non-conductive material, are formed or arranged in a at least partially overlapping manner, seen in a top view of the multilayer printed circuit board.

6. The multilayered printed circuit board according to claim 1, wherein the thickness of the at least one second interior layer, the at least one third interior layer, the first exterior layer and the second exterior layer that are composed of incombustible, conductive material is smaller than the thickness of the at least one first interior layer composed of non-conductive material.

7. The multilayered printed circuit board according to claim 1, wherein the number of the at least one first interior layer composed of non-conductive material is less than 7.

8. The multilayered printed circuit board according to claim 7, wherein the number of the at least one first interior layers composed of non-conductive material is less than 5.

9. The multilayered printed circuit board according to claim 1, wherein the maximum overall thickness of the multilayer printed circuit board is 1.25 mm.

10. The multilayered printed circuit board according to claim 9, wherein the maximum overall thickness of the multilayer printed circuit board 1 mm.

11. The multilayered printed circuit board according to claim 1, wherein each of the at least one second and third interior layers has a surface area of which at least 70% composed of the incombustible, conductive material.

12. The multilayered printed circuit board according to claim 1, wherein the flame retardant layer is a polyimide layer.

13. The multilayered printed circuit board according to claim 1, wherein the volume portion of layers composed of the incombustible, conductive material is at least 12% by volume of the multilayer printed circuit board.

14. A flame-resistant or smoke-suppressing multilayered printed circuit board comprising: a first core layer having a first surface and a second surface parallelly opposing to each other; a second layer and a third layer composed of an incombustible, conductive material and parallelly connecting with the first surface and the second surface of the first core layer, respectively, such that the first core layer is sandwiched between the second layer and the third layer; a fourth layer and a fifth layer composed of non-conductive material and parallelly connecting with the second layer and third layer, respectively, such that the first core layer, the second layer and the third layer are sandwiched between the fourth layer and the fifth layer; a sixth layer and a seventh layer composed of an incombustible, conductive material and parallelly connecting with the fourth layer and fifth layer, respectively, such that the first core layer, the second layer, the third layer, the fourth layer and the fifth layer are sandwiched between the sixth layer and the seventh layer; a first solder mask and a second solder mask parallelly connecting with the sixth layer and seventh layer, respectively, such that the first core layer, the second layer, the third layer, the fourth layer, the fifth layer, the sixth layer and the seventh layer are sandwiched between the first solder mask and the second solder mask; wherein each of the second, third, sixth and seventh layers has a surface area of which at least 50% composed of the incombustible, conductive material; wherein a flame-retardant or smoke-suppressing filler is added to the fourth and fifth layers; wherein the surface area of the incombustible, conductive material of each of the sixth layer and the seventh layer is larger than the surface portion of the first and second solder masks, respectively; and wherein the flame-retardant or smoke-suppressing filler is $Al(OH)_3$, $SiO_2$; wherein the incombustible, conductive material of the second layer and the third layer, the sixth layer and the seventh layer is copper; wherein the first core layer, the fourth layer and the fifth layer composed of a non-conductive material comprises dielectric material; wherein the flame-resistant or smoke-suppressing multilayered printed circuit board meets a smoke density test, namely a maximum optical smoke density Dm of 200 within 240 seconds; and wherein the volume portion of layers composed of the incombustible, conductive material is at least 8% by volume of the multilayer printed circuit board.

* * * * *